United States Patent
Watanabe

(10) Patent No.: US 11,424,330 B2
(45) Date of Patent: Aug. 23, 2022

(54) FIELD-EFFECT TRANSISTOR

(71) Applicant: Mitsubishi Electric Corporation, Tokyo (JP)

(72) Inventor: Shinsuke Watanabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/054,134

(22) PCT Filed: Oct. 3, 2018

(86) PCT No.: PCT/JP2018/037059
§ 371 (c)(1),
(2) Date: Nov. 9, 2020

(87) PCT Pub. No.: WO2020/070831
PCT Pub. Date: Apr. 9, 2020

(65) Prior Publication Data
US 2021/0126093 A1  Apr. 29, 2021

(51) Int. Cl.
| | | |
|---|---|---|
| H01L 29/40 | (2006.01) | |
| H01L 29/06 | (2006.01) | |
| H01L 29/423 | (2006.01) | |
| H01L 29/812 | (2006.01) | |
| H01L 29/861 | (2006.01) | |

(52) U.S. Cl.
CPC .......... *H01L 29/402* (2013.01); *H01L 29/06* (2013.01); *H01L 29/42316* (2013.01); *H01L 29/812* (2013.01); *H01L 29/861* (2013.01)

(58) Field of Classification Search
CPC . H01L 29/06; H01L 29/42316; H01L 29/812; H01L 29/861; H01L 27/0629; H01L 29/7786; H01L 29/2003; H01L 29/402–407; H01L 29/778–7789; H01L 29/122–127; H03F 2200/183
See application file for complete search history.

(56) References Cited

U.S. PATENT DOCUMENTS

2005/0274977 A1* 12/2005 Saito ................. H01L 29/41725
257/192
2012/0217581 A1*  8/2012 Kondou ............. H01L 29/7821
257/337
(Continued)

FOREIGN PATENT DOCUMENTS

| JP | 2017005139 A | 1/2017 |
|---|---|---|
| WO | 2013027722 A1 | 2/2013 |

OTHER PUBLICATIONS

International Search Report; Written Opinion; and Notification of Transmittal of The International Search Report and the Written Opinion of the International Searching Authority, or the Declaration issued in PCT/JP2018/037059; dated Nov. 27, 2018.

*Primary Examiner* — Shahed Ahmed
(74) *Attorney, Agent, or Firm* — Studebaker & Brackett PC

(57) ABSTRACT

A gate electrode (3), a source electrode (4), and a drain electrode (5) is provided on a surface of the semiconductor substrate (1,2). An insulating film (6) covers the surface of the semiconductor substrate (1,2) in a region between the gate electrode (3) and the drain electrode (5). A source field plate (7) is provided on the insulating film (6) and not connected with the drain electrode (5). A diode (8) has a cathode connected with the source field plate (7) and an anode having a constant potential.

13 Claims, 9 Drawing Sheets

(56) References Cited

U.S. PATENT DOCUMENTS

| | | |
|---|---|---|
| 2014/0203877 A1 | 7/2014 | Ota |
| 2016/0254258 A1* | 9/2016 | Tsuchiko ............ H01L 29/7835 257/272 |
| 2017/0018617 A1* | 1/2017 | Xia ....................... H01L 29/405 |
| 2019/0140086 A1* | 5/2019 | Chikamatsu .......... H01L 29/778 |

* cited by examiner

FIELD-EFFECT TRANSISTOR

FIELD

The present disclosure relates to a field-effect transistor.

BACKGROUND

For materials of semiconductor substrates, silicon, silicon carbide, gallium arsenide, gallium nitride, and indium phosphide are used. There is a field-effect transistor using a gallium nitride substrate among these semiconductor substrates. The present application describes a normally-on high-electron-mobility transistor in which drain-source current flows when gate voltage is zero volt.

Gallium nitride has a larger band gap, a higher saturation electron speed, and a higher insulation breakdown electric field strength than those of silicon or gallium arsenide. With these characteristics, a high-electron-mobility transistor using gallium nitride is expected to be a high frequency device that can achieve high efficiency and high gain while being capable of generating an output signal of large electrical power.

However, when high voltage of several ten volts is applied to a drain electrode and voltage close to zero volt is applied to a gate electrode to perform large electrical power operation, strong electric field is generated in the semiconductor substrate in the vicinity of the gate electrode. Hot electrons generated by this strong electric field can be captured in traps near the surface of the semiconductor or inside the semiconductor. Accordingly, accumulation of negative electric charge occurs and characteristic variation occurs in the transistor. When a high frequency signal having large electrical power is excessively input to the gate electrode, the drain voltage momentarily exceeds a hundred volts, the above-described accumulation of negative electric charge occurs, and the concentration of two-dimensional electron gas decreases. It is known that, as a result, decrease in maximum drain current or change in drain current at bias point can occur.

A source field plate is used to prevent such characteristic variation. This source field plate is connected with a source electrode or a ground pad. The electric field can be decreased as potential change near the gate electrode is decreased when the source field plate being grounded, in other words, having a potential of zero volt is placed close to the semiconductor surface between the gate and the drain. Accordingly, decrease in temporary characteristic variation, improvement of a transient response characteristic, and improvement of withstand voltage of the transistor can be achieved.

FIG. 15 is a load line diagram illustrating temporal change of the drain current and the drain voltage that occurs when a high frequency signal is input to the gate. State A is a state in which plus gate voltage is instantaneously input and then the drain current Id momentarily becomes large and the drain voltage Vd momentarily becomes low. State B is a state in which the drain current Id momentarily becomes small and the drain voltage Vd momentarily becomes high. Strong electric field is generated near the gate electrode by the high drain voltage Vd in State B, and characteristic variation occurs. With regard to this, in a disclosed device, the drain electrode and the source field plate are connected with each other through a resistor or a voltage dividing circuit (refer to PTL 1, for example). Accordingly, plus voltage is applied to the source field plate when the drain voltage Vd becomes high plus voltage, which is expected to prevent characteristic variation.

CITATION LIST

Patent Literature

[PTL 1] WO 2013/027722

SUMMARY

Technical Problem

However, the resistor is potentially damaged when the source field plate, which normally has zero volt, and the drain electrode, which instantaneously has a voltage of several hundred volts are connected through the resistor. In addition, formation of a path of a high frequency signal from the drain electrode to the source field plate near the gate electrode leads to formation of a loop path of a high frequency signal having large electrical power. The formation of the loop of a high frequency signal degrades characteristics of the high-electron-mobility transistor as well as damages the entire transistor through oscillation. Thus, reliability cannot be ensured, which has been a problem.

The inventor studied characteristic variation of the high-electron-mobility transistor by excessively inputting a high frequency signal to the transistor under various situations. The shape of a load line was changed by attaching various loads to the drain to determine the magnitude of characteristic variation of the transistor. As a result, it was found that characteristic variation occurs not only in State B but also in State A. In a recent high-electron-mobility transistor using gallium nitride in which high bias voltage is applied to the drain, high electric field is generated near the gate electrode even in State A. Impact ionization occurs when careers are in the high electric field, and holes are generated, which may be a cause of characteristic variation. It is thought that a large number of holes are generated in State A in which a large number of careers pass directly below the gate. In addition, hole injection from the gate electrode to the semiconductor substrate occurs in State A in which the gate voltage momentarily becomes plus.

In addition, the inventor found that characteristic variation of the transistor increases when a source field plate having a size equal to or larger than a certain size is present. This is thought to be because the above-described holes accumulate in an insulating film or semiconductor directly below the source field plate. Thus, electric field relaxation is preferably performed by setting zero volt to the potential of the source field plate in State B, and hole accumulation is preferably reduced by applying positive voltage to the source field plate in State A. However, in a conventional device, the potential of the source field plate changes with the drain voltage, and thus the behavior thereof is opposite to ideal potential change. Thus, characteristic variation cannot be prevented, which has been another problem.

The present invention is intended to solve the problems as described above and obtain a field-effect transistor that can ensure reliability and prevent characteristic variation.

Solution to Problem

A field-effect transistor according to the present disclosure includes: a semiconductor substrate; a gate electrode, a source electrode, and a drain electrode on a surface of the semiconductor substrate; an insulating film covering the surface of the semiconductor substrate in a region between the gate electrode and the drain electrode; a source field plate on the insulating film and not connected with the drain electrode; and a diode having a cathode connected with the source field plate and an anode having a constant potential, wherein a shortest distance between the gate electrode and the source field plate is 1 µm or shorter.

Advantageous Effects of Invention

In the present disclosure, since the shortest distance between the gate electrode and the source field plate is 1 µm or shorter, the potential of the source field plate follows the gate voltage. Then, the diode having the cathode connected with the source field plate and the anode having a constant potential is provided. With this configuration, the behavior of the potential of the source field plate is ideal, and thus characteristic variation can be prevented. In addition, since the source field plate is not connected with the drain electrode, no loop path of a high frequency signal having large electrical power is formed. With this configuration, no characteristic degradation of the high-electron-mobility transistor nor damage of the transistor due to oscillation occurs, and thus reliability can be ensured.

DESCRIPTION OF EMBODIMENTS

A field-effect transistor according to the embodiments of the present disclosure will be described with reference to the drawings. The same components will be denoted by the same symbols, and the repeated description thereof may be omitted.

Embodiment 1

Figure 1:
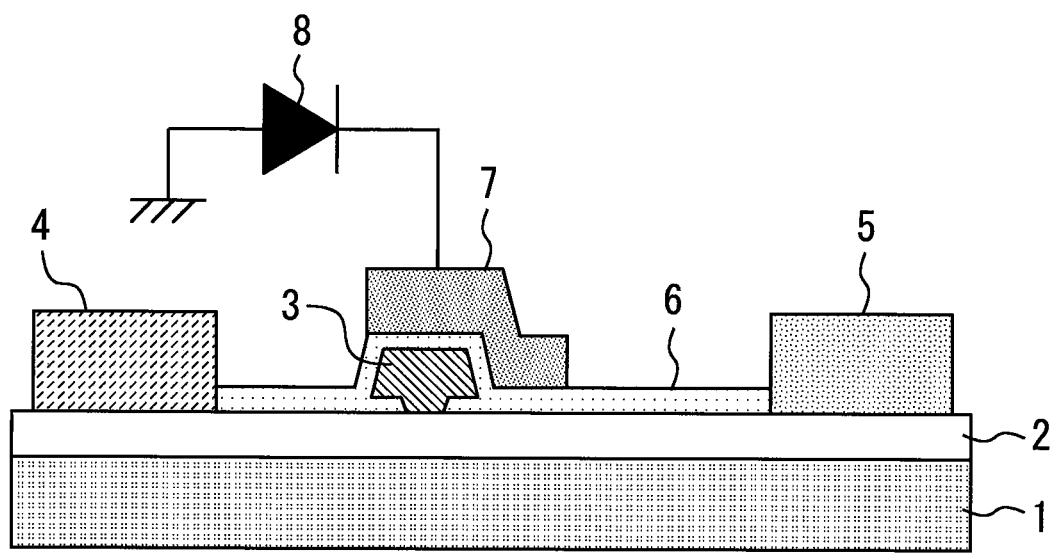
FIG. 1 is a cross-sectional view illustrating a field-effect transistor according to Embodiment 1.
Figure 2:
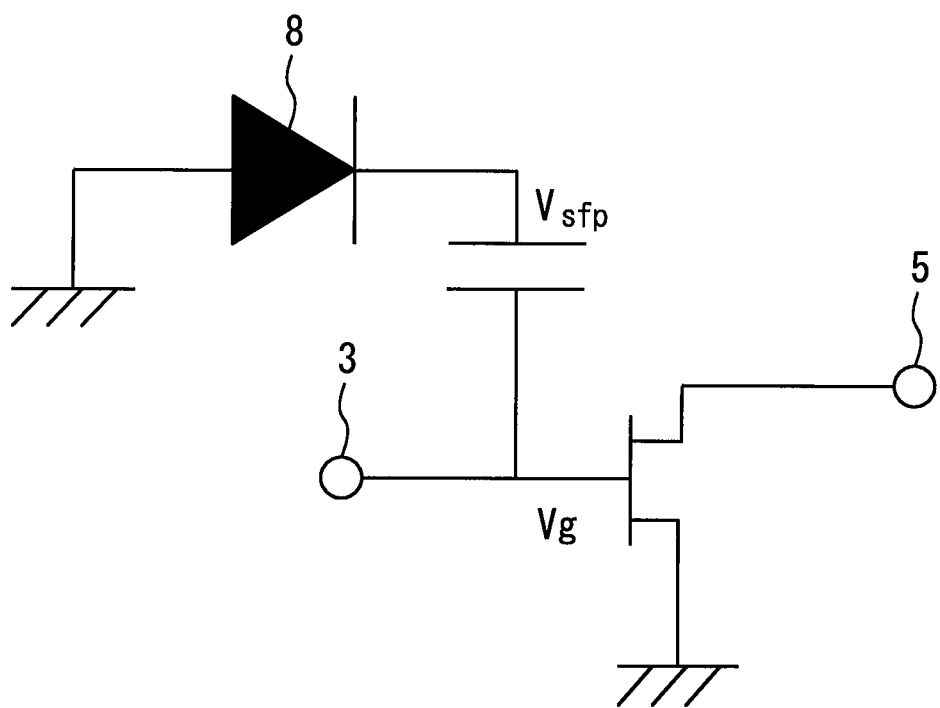
FIG. 2 is an equivalent circuit diagram illustrating the field-effect transistor according to Embodiment 1.

FIG. 1 is a cross-sectional view illustrating a field-effect transistor according to Embodiment 1. FIG. 2 is an equivalent circuit diagram illustrating the field-effect transistor according to Embodiment 1. This field-effect transistor is a normally-on high-electron-mobility transistor configured to amplify a high frequency signal.

An AlGaN layer 2 is formed on a GaN substrate 1. A gate electrode 3, a source electrode 4, and a drain electrode 5 that are made of metal are formed on the surface of the AlGaN layer 2. An insulating film 6 covers the surface of the gate electrode 3 and the surface of the AlGaN layer 2. Accordingly, the insulating film 6 covers the surface of the AlGaN layer 2 in a region between the gate electrode 3 and the drain electrode 5.

A source field plate 7 made of metal is formed on the insulating film 6. The source field plate 7 is not connected with the drain electrode 5. The cathode of a diode 8 is connected with the source field plate 7. The anode of the diode 8 has the ground potential and is connected with, for example, the source electrode 4, or a ground pad having the ground potential.

Two-dimensional electron gas is generated in a region close to the AlGaN layer 2 inside the GaN substrate 1 through piezo polarization that occurs due to lattice mismatch between GaN and AlGaN. This two-dimensional electron gas is current between the drain electrode 5 and the source electrode 4. The two-dimensional electron gas is changed depending on voltage applied to the gate electrode 3, thereby enabling on-off switching of drain-source current. When appropriate bias voltage is applied to the gate electrode 3, the drain electrode 5, and the source electrode 4 and a high frequency signal is input to the gate electrode 3, a high frequency signal having large electrical power is generated at the drain electrode 5, thereby achieving an amplification effect.

Figure 15:
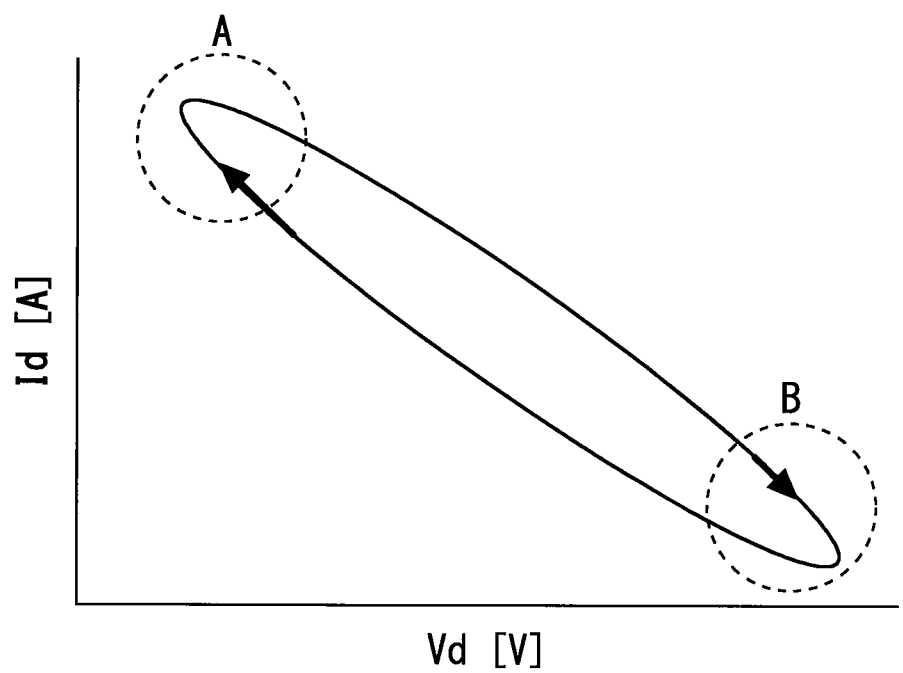
FIG. 15 is a load line diagram illustrating temporal change of the drain current and the drain voltage that occurs when a high frequency signal is input to the gate.

Consider a case in which the drain voltage and the drain current are changed as illustrated in FIG. 15 as a high frequency signal having large electrical power is input to the gate electrode 3. In State B in which the drain current is small, the gate voltage is minus. The source field plate 7 tends to assume minus, following the gate voltage. However, upon application of forward voltage, the diode 8 is placed into a short-circuited state. Accordingly, the potential of the source field plate 7 forcibly becomes equal to the ground potential, in other words, zero volt.

On the other hand, in State A in which the input signal has sufficiently large electrical power, the gate voltage varies to plus voltage. In this case, the potential of the source field plate 7 becomes plus, following the gate voltage. Upon application of reverse voltage, the diode 8 becomes a released state. Thus, the source field plate 7 is placed into a float state. In this case, the potential of the source field plate 7 becomes plus irrespective of the ground potential, following the gate voltage.

Accordingly, in the present embodiment, an ideal state in which the potential of the source field plate 7 is zero volt in State B or plus potential in State A is automatically achieved. Thus, when the drain voltage is high, the source field plate 7 having a potential of zero volt decreases electric field near the gate electrode 3. When the gate voltage is high and the drain current is large, hole accumulation is prevented by plus potential applied to the source field plate 7. In this manner, a plurality of mechanisms that would cause characteristic change of the high-electron-mobility transistor are removed.

Temporal change of a gate voltage Vg and a potential Vsfp of the source field plate 7 was simulated by using characteristics of the high-electron-mobility transistor and the diode 8 and the value of capacitance between the source field plate 7 and the gate electrode 3, which were determined by actual measurement. The frequency of a high frequency signal input to the gate electrode 3 was 2.7 gigahertz. The electrical power of the input high frequency signal was changed from −10 dBm to +25 dBm at the step of 1 dBm.

Figure 3:
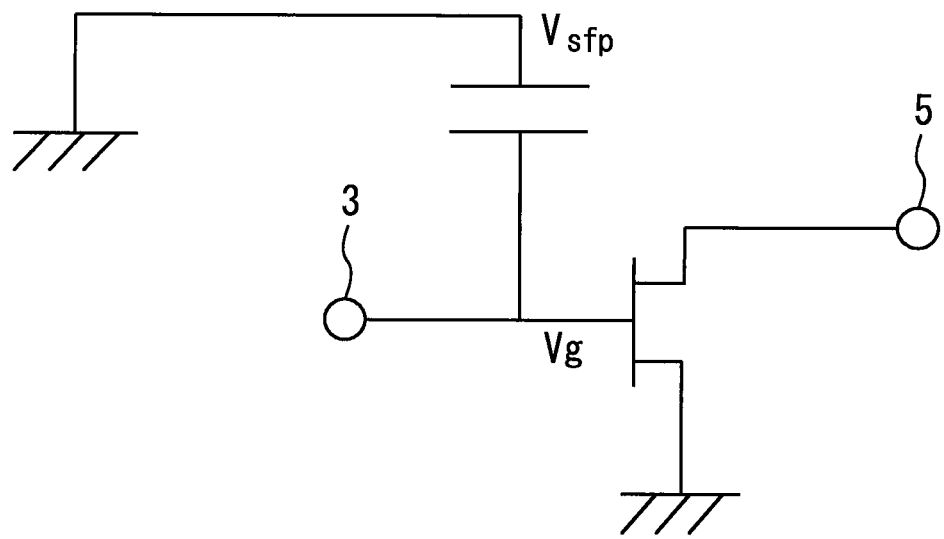
FIG. 3 is an equivalent circuit diagram illustrating a state in which the source field plate is connected with the ground.
Figure 4:
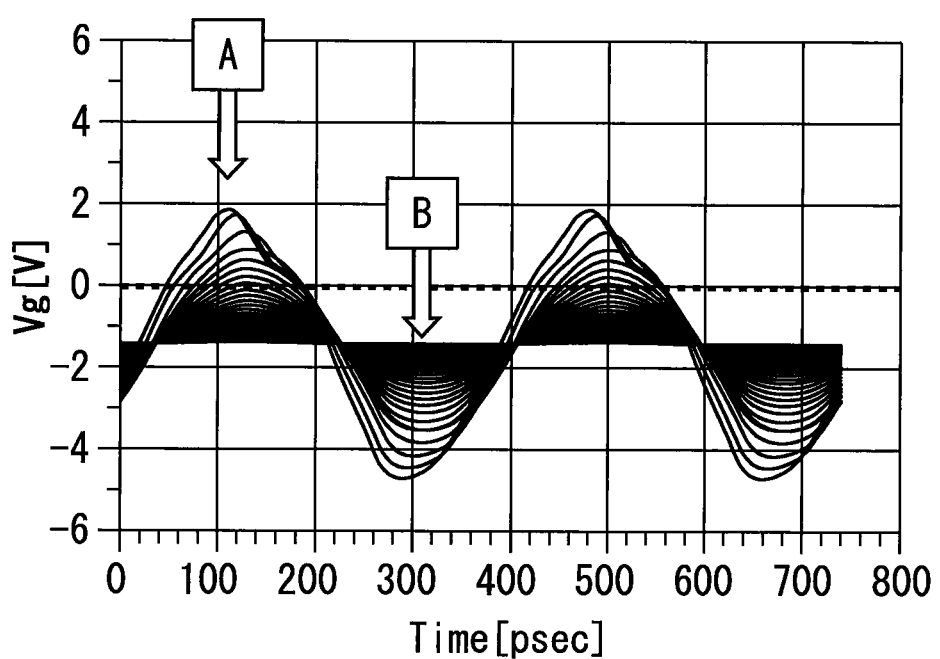
FIG. 4 is a diagram illustrating temporal change of the gate voltage when the source field plate is connected with the ground.

FIG. 3 is an equivalent circuit diagram illustrating a state in which the source field plate is connected with the ground. FIG. 4 is a diagram illustrating temporal change of the gate voltage when the source field plate is connected with the ground. A plurality of lines illustrated in the drawing each correspond to a case in which the input electrical power is changed at the step of 1 dBm. A moment at which the gate voltage Vg becomes high is State A in which large drain current flows to the transistor. A moment at which the gate voltage becomes low is State B in which the drain current becomes small.

Figure 5:
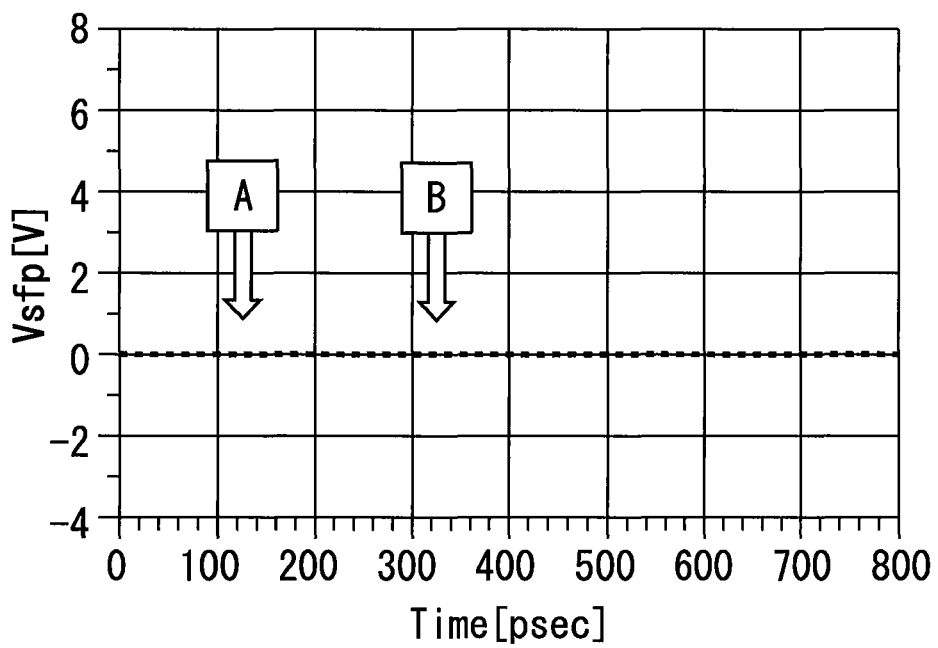
FIG. 5 is a diagram illustrating temporal change of the potential of the source field plate when the source field plate is connected with the ground.

FIG. 5 is a diagram illustrating temporal change of the potential of the source field plate when the source field plate is connected with the ground. The potential Vsfp of the source field plate 7 is zero volt irrespective of the gate voltage Vg when the source field plate 7 is connected with the ground.

Figure 6:
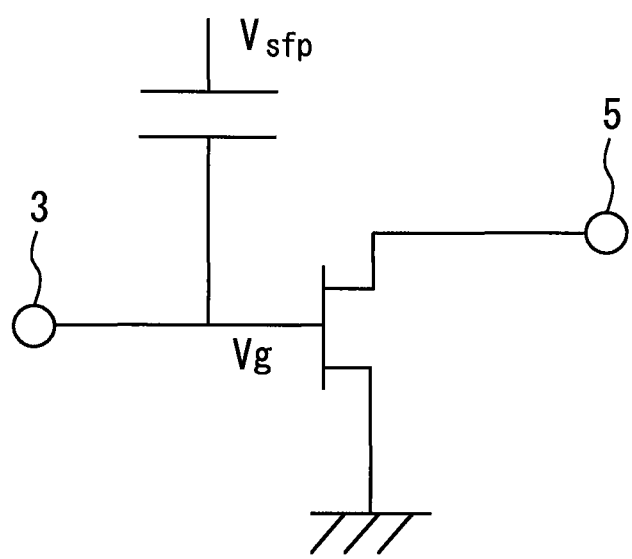
FIG. 6 is an equivalent circuit diagram illustrating a state in which the source field plate is floating.
Figure 7:
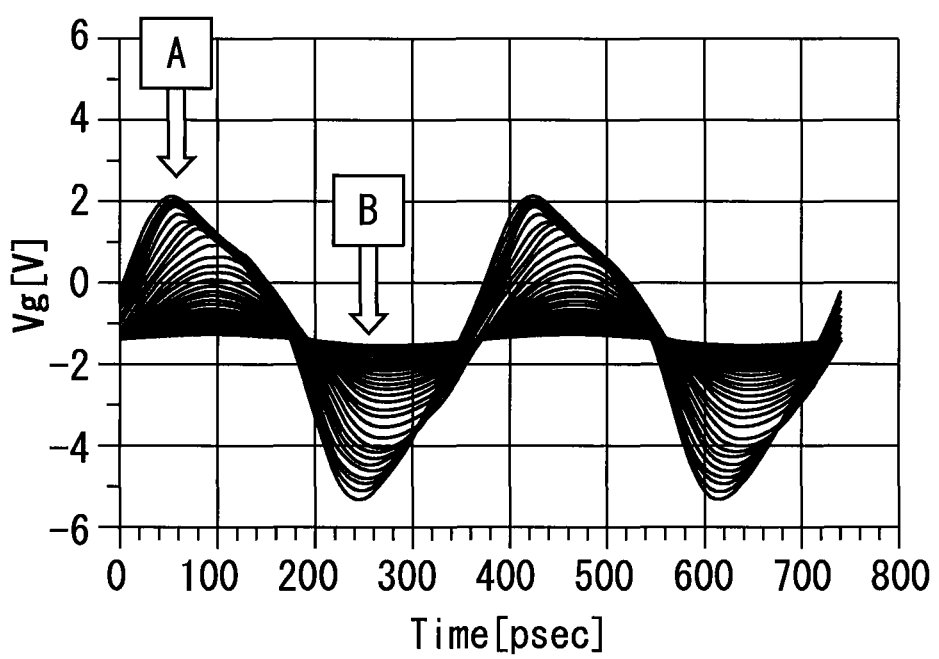
FIG. 7 is a diagram illustrating temporal change of the gate voltage when the source field plate is floating.
Figure 8:
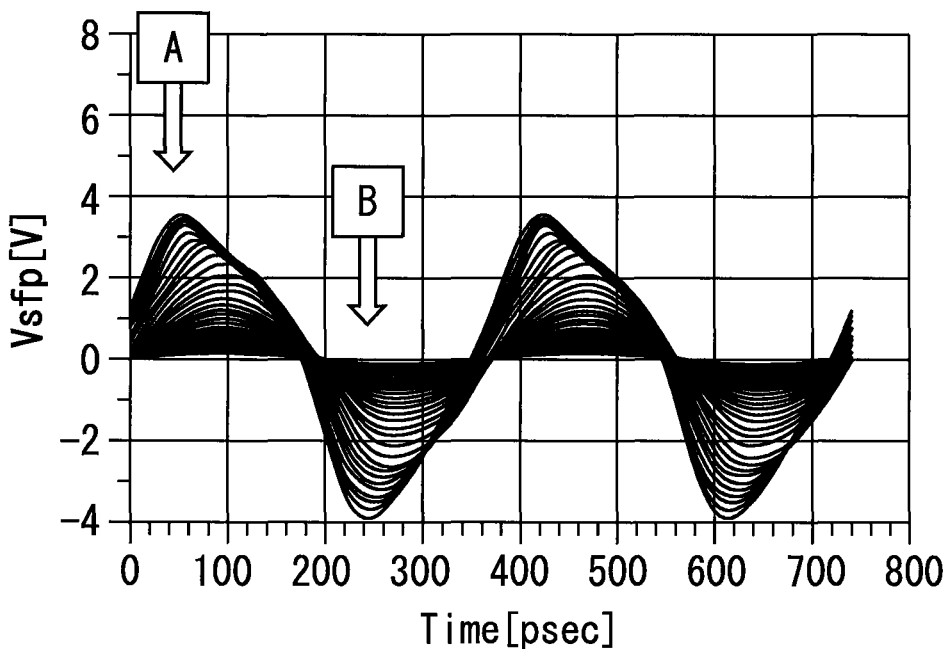
FIG. 8 is a diagram illustrating temporal change of the potential of the source field plate when the source field plate is floating.

FIG. 6 is an equivalent circuit diagram illustrating a state in which the source field plate is floating. FIG. 7 is a diagram illustrating temporal change of the gate voltage when the source field plate is floating. FIG. 8 is a diagram illustrating temporal change of the potential of the source field plate when the source field plate is floating. When the source field plate 7 is sufficiently close to the gate electrode 3 and the value of capacitance between both members is large, the potential Vsfp of the source field plate 7 follows the gate voltage Vg. As a result, the gate voltage Vg and the potential Vsfp of the source field plate have temporal waveforms of the same shape although the amplitudes thereof are not necessarily same.

Figure 9:
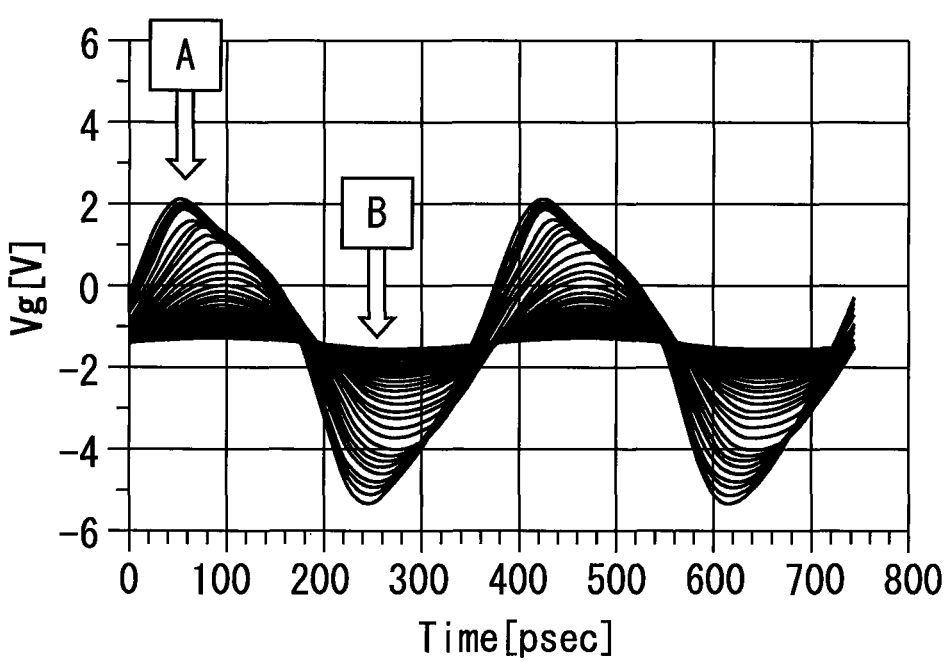
FIG. 9 is a diagram illustrating temporal change of the gate voltage Vg of the field-effect transistor according to Embodiment 1.
Figure 10:
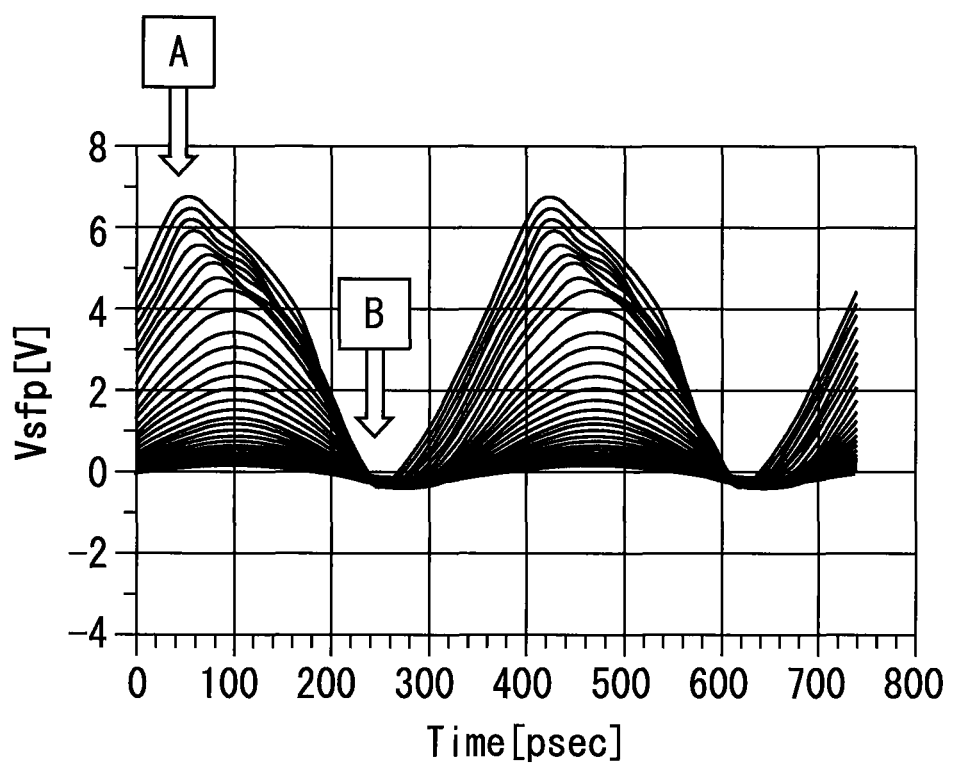
FIG. 10 is a diagram illustrating temporal change of the potential of the source field plate of the field-effect transistor according to Embodiment 1.

FIG. 9 is a diagram illustrating temporal change of the gate voltage Vg of the field-effect transistor according to Embodiment 1. FIG. 10 is a diagram illustrating temporal change of the potential of the source field plate of the field-effect transistor according to Embodiment 1. This is a simulation result of such an ideal behavior that the potential Vsfp of the source field plate 7 is plus voltage in State A or zero volt in State B.

However, the source field plate 7 needs to be sufficiently close to the gate electrode 3 so that the potential Vsfp of the source field plate 7 follows the gate voltage Vg. Specifically, the shortest distance between the gate electrode 3 and the source field plate 7 is 1 µm or shorter.

Figure 11:
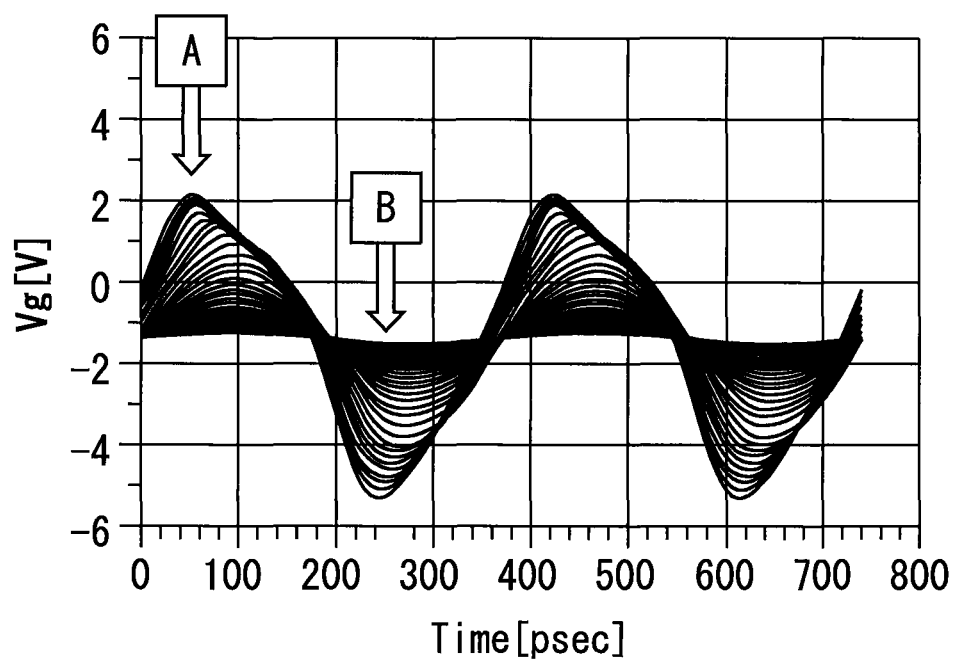
FIG. 11 is a diagram illustrating temporal change of the gate voltage when the shortest distance between the gate electrode and the source field plate is 2 µm.
Figure 12:
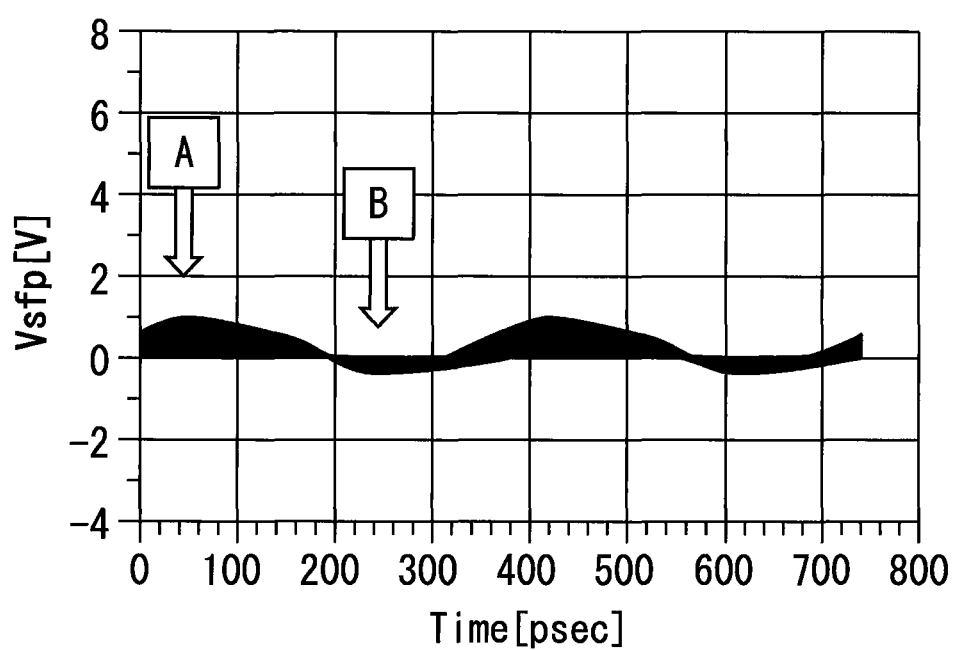
FIG. 12 is a diagram illustrating temporal change of the potential of the source field plate when the shortest distance between the gate electrode and the source field plate is 2 µm.

In the above-described simulation, a high-electron-mobility transistor in which the value of capacitance between the gate electrode 3 and the source field plate 7 is 3 pF was used. On the other hand, when it is assumed that the gate electrode 3 and the source field plate 7 have an overlapping area of 1560 µm² and the insulating film 6 is SiN having a dielectric constant of 7, the value of capacitance is 0.05 pF for the shortest distance of 2 µm between the gate electrode 3 and the source field plate 7. FIG. 11 is a diagram illustrating temporal change of the gate voltage when the shortest distance between the gate electrode and the source field plate is 2 µm. FIG. 12 is a diagram illustrating temporal change of the potential of the source field plate when the shortest distance between the gate electrode and the source field plate is 2 µm. Thus, it is understood that change of the gate voltage Vg is not reflected onto the potential Vsfp of the source field plate 7 when the shortest distance is larger than 1 µm.

As described above, in the present embodiment, since the shortest distance between the gate electrode 3 and the source field plate 7 is 1 µm or shorter, the potential Vsfp of the source field plate 7 follows the gate voltage Vg. Then, the diode 8 having the cathode connected with the source field plate 7 and the anode having a constant potential is provided. With this configuration, the behavior of the potential Vsfp of the source field plate 7 is ideal, and thus characteristic variation can be prevented. In addition, since the source field plate 7 is not connected with the drain electrode 5, no loop path of a high frequency signal having large electrical power is formed. With this configuration, no characteristic degradation of the high-electron-mobility transistor nor damage of the transistor due to oscillation occurs, and thus reliability can be ensured.

The diode 8 is a Schottky diode or a PN diode. It is difficult to use a Zener diode having an intentionally lowered breakdown voltage together with a large electrical power transistor, and thus the Zener diode is not used as the diode 8.

Embodiment 2

Figure 13:
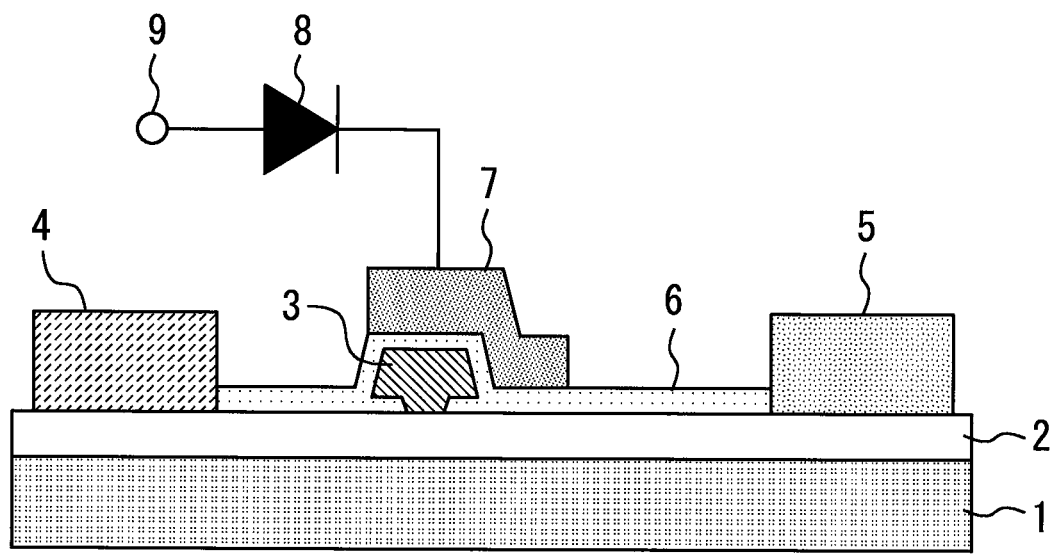
FIG. 13 is a cross-sectional view illustrating a field-effect transistor according to Embodiment 2.

FIG. 13 is a cross-sectional view illustrating a field-effect transistor according to Embodiment 2. In Embodiment 1, switching between the released state and short-circuited state of the diode 8 is determined by a characteristic of the diode 8, namely, the rising voltage of the diode 8. Depending on a prepared diode 8, the rising voltage thereof is not suitable for a high-electron-mobility transistor in some cases. Thus, in the present embodiment, the anode of the diode 8 is connected not with the ground but with a DC pad 9 to which direct-current voltage is applied.

When direct-current voltage is applied to the anode of the diode 8, a time during which the diode 8 is in the short-circuited state is changed and a time during which the potential of the source field plate 7 is zero volt is changed. Specifically, the temporal waveform of the potential of the source field plate 7 illustrated in FIG. 10 can be adjusted to be more appropriate by changing the voltage applied to the DC pad 9. When the potential of the source field plate 7 needs to be lowered for a longer time, plus voltage is applied to the DC pad 9 so that forward voltage is likely to be applied to the diode 8. Conversely, when the potential of the source field plate 7 needs to be plus for a longer time, minus voltage is applied to the DC pad 9 so that reverse voltage is likely to be applied to the diode 8. Accordingly, characteristic variation can be more reliably prevented.

Embodiment 3

Figure 14:
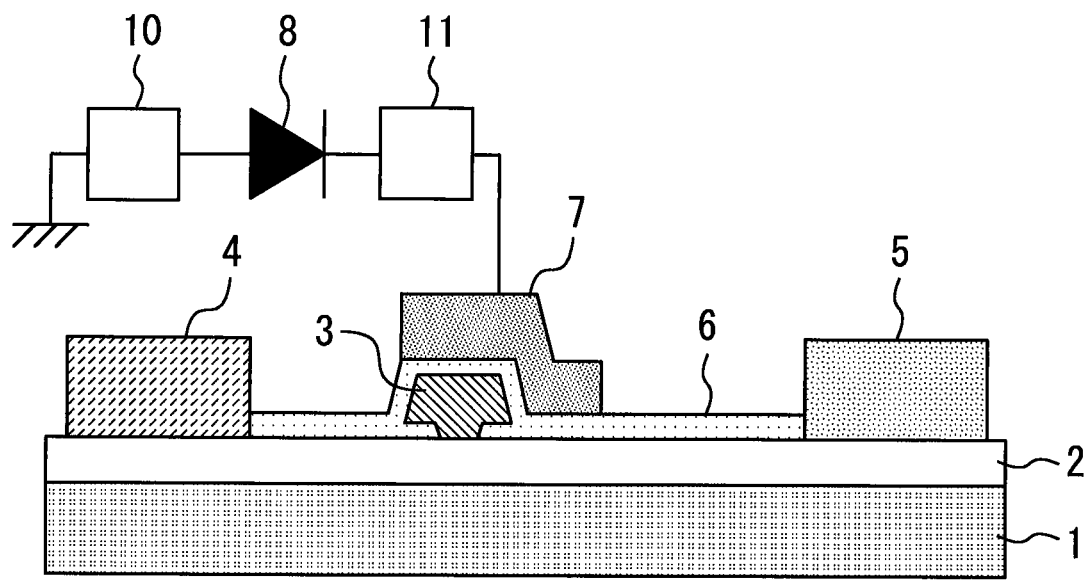
FIG. 14 is a cross-sectional view illustrating a field-effect transistor according to Embodiment 3.

FIG. 14 is a cross-sectional view illustrating a field-effect transistor according to Embodiment 3. Matching circuits 10 and 11 are connected with the anode and cathode, respectively, of the diode 8. The matching circuits 10 and 11 each include a capacitor, an inductor, a resistor, a signal line, and the like.

The temporal waveforms of potential at the cathode and anode of the diode 8 are each changed by a capacitor or inductor installed nearby or the like. Thus, the temporal waveform of the voltage applied to the diode 8 and the temporal waveform of the potential of the source field plate 7 can be optionally adjusted by adjusting the matching circuits 10 and 11 connected with the diode 8.

REFERENCE SIGNS LIST

1,2 semiconductor substrate; 3 gate electrode; 4 source electrode; 5 drain electrode; 6 insulating film; 7 source field plate; 8 diode; 9 DC pad; 10,11 matching circuit

The invention claimed is:

1. A field-effect transistor comprising:
   a semiconductor substrate;
   a gate electrode, a source electrode, and a drain electrode on a surface of the semiconductor substrate;
   an insulating film covering the surface of the semiconductor substrate in a region between the gate electrode and the drain electrode;
   a source field plate on the insulating film and not connected with the drain electrode; and
   a diode having a cathode connected with the source field plate and an anode having a constant potential irrespective of a voltage applied between the gate electrode and the source electrode,
   wherein a shortest distance between the gate electrode and the source field plate is 1 μm or shorter.

2. The field-effect transistor according to claim 1, wherein the anode of the diode is connected with the source electrode, or a ground pad having ground potential.

3. The field-effect transistor according to claim 1, wherein the anode of the diode is connected with a DC pad to which direct-current voltage is applied.

4. The field-effect transistor according to claim 1, wherein the diode is a Schottky diode or a PN diode.

5. The field-effect transistor according to claim 1, further comprising a matching circuit connected with the anode or the cathode of the diode.

6. The field-effect transistor according to claim 2, wherein the diode is a Schottky diode or a PN diode.

7. The field-effect transistor according to claim 3, wherein the diode is a Schottky diode or a PN diode.

8. The field-effect transistor according to claim 2, further comprising a matching circuit connected with the anode or the cathode of the diode.

9. The field-effect transistor according to claim 3, further comprising a matching circuit connected with the anode or the cathode of the diode.

10. The field-effect transistor according to claim 4, further comprising a matching circuit connected with the anode or the cathode of the diode.

11. The field-effect transistor according to claim 6, further comprising a matching circuit connected with the anode or the cathode of the diode.

12. The field-effect transistor according to claim 7, further comprising a matching circuit connected with the anode or the cathode of the diode.

13. The field-effect transistor according to claim 1, wherein the cathode of the diode is capacitively coupled with the gate electrode by way of the insulating film and the source field plate.

\* \* \* \* \*